United States Patent [19]

Chun

[11] Patent Number: 5,012,162

[45] Date of Patent: Apr. 30, 1991

[54] LIGHT EMITTING DIODE TRANSMITTER CIRCUIT WITH TEMPERATURE COMPENSATION

[75] Inventor: Cornell S. L. Chun, Eagan, Minn.

[73] Assignee: Unisys Corporation, Blue Bell, Pa.

[21] Appl. No.: 508,450

[22] Filed: Apr. 13, 1990

[51] Int. Cl.$^5$ ............................................. H05B 39/04
[52] U.S. Cl. .................................... 315/309; 455/613
[58] Field of Search .......................... 315/309; 307/270; 372/38; 455/613; 323/907

[56] References Cited

U.S. PATENT DOCUMENTS

| | | | |
|---|---|---|---|
| 4,243,952 | 1/1981 | Patterson | 372/38 |
| 4,580,293 | 4/1986 | Reichle | 455/613 |
| 4,580,294 | 4/1986 | Nordholt | 372/38 |
| 4,943,737 | 7/1990 | Guo | 323/907 |

OTHER PUBLICATIONS

Miller, S. E. and Kaminow, I. P., *Optical Fiber Telecommunications*, Academic Press, 1988, pp. 727-730.

*Primary Examiner*—Eugene R. LaRoche
*Assistant Examiner*—Amir Zarabian
*Attorney, Agent, or Firm*—Glenn W. Bowen; Mark T. Starr

[57] ABSTRACT

A light emitting diode circuit with an emitter coupled logic (ECL) interface is provided with temperature compensation by a series circuit consisting of a pair of resistors which are separated by at least one diode. A first switching field-effect-transistor which receives the output of the interface has its drain-to-source path coupled to the junction of one of the resistors and the diodes, while an output drive field-effect-transistor has its gate coupled to the junction of the other resistor and the diodes and its drain-to-source path coupled in series with a light emitting diode (LED).

11 Claims, 1 Drawing Sheet

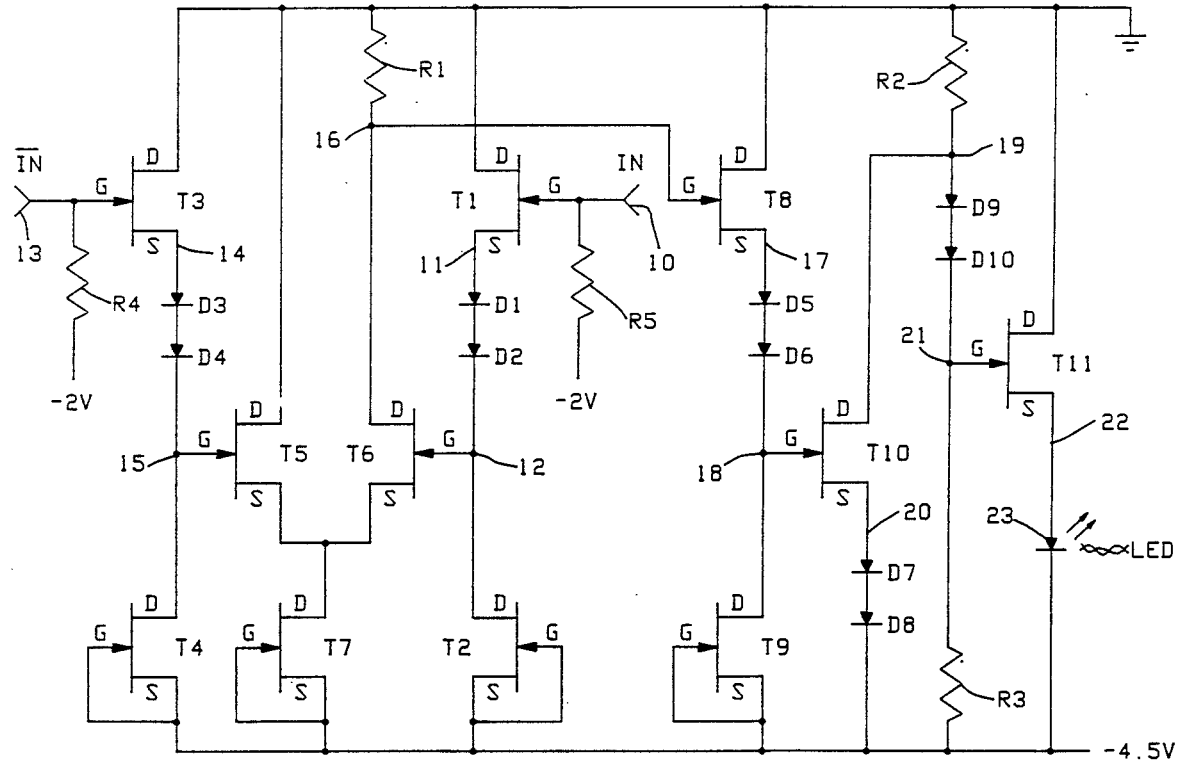

United States Patent Office

PTO - BOYERS, PA Duty Station

MISSING PAGE TEMPORARY NOTICE

PATENT # 5,012,162    FOR ISSUE DATE 4-30-1991

HAS BEEN SCANNED, BUT WITH MISSING PAGE(S). UPON RECEIVING OF MISSING PAGE(S), THE ENTIRE DOCUMENT WILL RE RESCANNED. PLEASE CALL IMAGE DATA ADMINISTRATION STAFF OF 557-6154 IF YOU HAVE A QUESTION. ASK FOR DAVE GROOMS, ANITA YOUNG OR POLA JONES.

THIS NOTICE IS FOR THE MISSING PAGE CONTAINING:

DRAWING SHEET # 1

N/A at Boyers
7/30/92

Data Conversion Operation
Boyers, Pa

LIGHT EMITTING DIODE TRANSMITTER CIRCUIT WITH TEMPERATURE COMPENSATION

BACKGROUND OF THE INVENTION

1. Field of the Invention

This invention relates to a transmitter for optical data communication. More particularly, this invention relates to a light emitting diode transmitter circuit with temperature compensation and with an input which is compatible with emitter coupled logic.

2. Description of Prior Art

In the present state of the art, optical data communication systems require transmitters which can convert electrical analogue or logic signals into lightwave signals. Commercially available emitter coupled logic (ECL) integrated circuits can operate up to the range of 200 to 300 megabits per second. This range is matched by the operating range of light emitting diodes (LED's). The electronic circuit which converts the logic or analogue input signal into a modulated current flowing through the LED is called a driver. For effective optical data communication the optical signal of the LED is required to be modulated with large amplitude, thus the driver is required to provide a large modulation of current through the LED.

Many applications require operation of the transmitter in wide temperature ranges. For example, in military applications operation at temperatures of −55 to 125 degrees Celsius are often required. However, the intensity output of LED's is sensitive to temperature variations such that intensity decreases as temperature increases. The effect of temperature increase can be compensated by increasing the current flowing through the LED, thereby restoring the optical intensity. For applications where the temperature can vary but the transmitter output signal must not vary in amplitude, the driver circuit must be supplemented by a circuit which senses the temperature increase and causes the LED current to increase.

Heretofore, LED driver integrated circuits with temperature compensation were known. A review of such circuits is given in Optical Fiber Telecommunications, Ed. S. E. Miller and I. P. Kaminow, Academic Press, 1988, pp. 727-730. However, in such circuits the LED current flows through many transistors comprising the driver and/or the temperature compensation circuitry. This means that the transistors for the driver and temperature compensation must be able to handle the large currents required for the LED. Transistors with larger currents have higher power dissipation, shorter operational lifetimes and are more expensive. The principal object of the present invention is to provide a transmitter circuit where the LED current flows only through one transistor in the driver and does not flow through the temperature compensation circuit.

An object of the present invention is to provide a transmitter circuit which can be fabricated from the metal semiconductor field effect transistor (FET) process for integrated circuit fabrication. As described in the review by Miller and Kaminow, driver circuits with temperature compensation have utilized bipolar transistors. However, the proliferation of foundries for the custom fabrication of FET integrated circuits has resulted in the need for new driver circuits which take advantage of the advantages of FET processing while minimizing their weaknesses. Among these advantages is a high reproducibility of transistors. Among the weaknesses is a low precision in resistors. The present invention of a LED driver circuit with temperature compensation maximizes the use of transistors and minimizes the use of resistors.

Another object of the present invention is to provide a transmitter circuit which is capable of being fabricated with the driver circuit and LED on the same integrated circuit substrate, also known as monolithic integration. Recent developments in semiconductor device processing methods enable the fabrication of such an integrated transmitter.

Summary of the Invention

The present invention is a new and improved transmitter circuit which converts an analogue or logic input signal into an optical signal. The configuration of the LED allows current to flow through one transistor instead of many transistors. This arrangement reduces power dissipation and expense and increases the operational lifetime of the transmitter. The circuit is compatible with FET processes for the fabrication of integrated circuits. The transmitter can be manufactured in many of the custom integrated circuit foundries that are available. The design allows for the integration of the circuit onto a single substrate that includes the transmitter circuit and the LED.

BRIEF DESCRIPTION OF THE DRAWING

The sole FIGURE is a schematic circuit diagram of a preferred embodiment of the present invention.

DESCRIPTION OF THE PREFERRED EMBODIMENT

The sole FIGURE is a schematic circuit diagram of a circuit for a transmitter for conversion of electrical analogue and logic signals into optical signals that utilizes N channel, depletion mode, field-effect-transistors (FET's). Transistors T1, T3, T5, T8 and T11 have their drains (D) directly coupled to ground. Transistors T6 and T10 have their drains coupled to ground through resistors. Transistors T2, T4, T7, T9 have their sources (S) coupled to their gates (G) so they act like resistors. An input channel 10 is connected to the gate of FET T1. Input channel 10 is also connected to a −2 volt power supply through a resistor 13 that provides appropriate ECL termination. FET transistors T1 and T2 are in a source follower arrangement where the voltage at terminal 11 of transistor T1 is identical to the voltage at the input channel 10. Diodes D1 and D2 serve as voltage level shifters, so the voltage at node 12 is shifted negative in its DC component. The voltage at node 12 is connected to the first input of a differential amplifier formed by transistors T5, T6, and T7 and resistor R1. The source follower comprised of transistors T1 and T2 and diodes D1 and D2 also serve to electrically buffer the differential amplifier formed by transistors T5, T6 and T7 and resistor R1 from the input channel 10.

In a similar manner, the input channel 13, which is the logical complement of the input channel 10, is connected to transistor T3. Transistors T3 and T4 and diodes D3 and D4 are in a source follower arrangement with level shifting resulting in the voltage at node 15 being a replica of the voltage at input channel 13 shifted negative in DC level. The voltage at terminal 15 is the second input to the differential amplifier formed by transistors T5, T6, and T7 and resistor R1. The source follower comprised of transistors T3 and T4 and diodes D3 and D4 also serve to electrically buffer the differential amplifier formed by transistors T5, T6, T7 and resistor R1 from the input channel 13.

The output of the differential amplifier formed by transistors T5, T6 and T7 and resistor R1 is at node 16. Node 16 is connected to the gate of transistor T8. Transistors T8 and T9 and diodes D5 and D6 constitute a source follower with level shifting. The voltage at node 18 is the same as the voltage at node 16 with a negative DC level shift. The source follower formed by transistors T8 and T9 and diodes D5 and D6 also serves to electrically buffer the differential amplifier formed by transistors T5, T6, and T7 and resistor R1 from the electrical load at node 18.

The source follower comprised of transistors T1 and T2 and diodes D1 and D2, the source follower comprised of transistors T3 and T4 and diodes D3 and D4, the differential amplifier comprised of transistors T5, T6, and T7 and resistor R1, and the source follower comprised of transistors T8 and T9 and diodes D5 and D6 together comprise the interface circuit with the differential ECL input channels at 10 and 13. The output of the interface is a single ended voltage signal at node 18.

Node 18 is connected to the gate of transistor T10. Transistor T10 serves as a current switch permitting or inhibiting current to flow from node 19 to terminal 20 of transistor T10. Diodes D7 and D8 establish the DC level of the source 20 of transistor T10 such that the voltage signal at node 18 can turn on or cut off the current flowing from node 19 to terminal 20 of transistor T10. Transistor T10 and diodes D7 and D8 comprise a modulator for current flowing from node 19 to terminal 20.

Transistor T11 and LED 23 are arranged such that the drain to source current of transistor T11 is controlled by the voltage at the gate of transistor T11 which is connected to node 21. The voltage at node 21 is determined by the voltage divider formed by resistors R2 and R3. Diodes D9 and D10 serve as a level shifter within the voltage divider. Diodes D9 and D10 also serve to sense the temperature of the transmitter containing the LED 23. Resistors R2 and R3 and diodes D9 and D10 constitute a temperature compensation circuit. Resistor R2 is connected to the output of the modulator at node 19.

Typical component values and types of components of the various circuit elements are shown in the table.

| TABLE | |
| --- | --- |
| R1 | 130 ohms |
| R2 | 250 ohms |
| R3 | 300 ohms |
| D1 to D10 | GigaBit Logic Diodes 16G010 |
| T1 to T11 | GigaBit Logic FET Transistors 16G020 |

In operation the transmitter circuit functions by detecting a high ECL state at the input channel 10 and causing the LED to be illuminated. When a high logic state, that is a high voltage, exists at the input channel 10, the source follower comprised of transistors T1 and T2 and diodes D1 and D2 causes a high state to exist at node 12. Node 12 is connected to the first input to the differential amplifier formed from transistors T5, T6 and T7 and resistor R1. The complement of the high state, that is a low voltage, exists at input channel 13. The source follower formed by transistors T3 and T4 and diodes D3 and D4 cause a low voltage at node 15.

Node 15 is connected to the second input to the differential amplifier formed from transistors T5, T6 and T7 and resistor R1. The differential amplifier formed from transistors T5, T6 and T7 and resistor R1 responds with a low voltage at node 16. Node 16 is connected to the source follower consisting of transistors T8 and T9 and diodes D5 and D6. This source follower responds with a low voltage at node 18. A low voltage at node 18 causes transistor T10 to be in a cut off condition where no current flows from the drain to source of transistor T10. Hence no current flows from node 19 to terminal 20 of transistor T10. The voltage at node 21 is determined solely by the voltage divider consisting of resistors R2 and R3 and diodes D9 and D10. Node 21 which is at a high voltage is connected to the gate of transistor T11. A high voltage on the gate of transistor T11 causes current to flow from the drain to source of transistor T11 and through LED 23 resulting in the illumination of the LED 23. The magnitude of the optical intensity of LED 23 is determined by the current flowing through T11. The current flowing through T11 is determined by the voltage at node 21. The voltage at node 21 is determined by the amount of level shifting in diodes D9 and D10. The level shifting in each of diodes D9 and D10 is determined by the temperature of the diode. An increase in temperatures causes a decrease in level shifting. A decrease in level shifting in diodes D9 and D10 causes a more positive voltage at node 21. A more positive voltage at node 21 causes more current to flow through transistor T11 and LED 23 resulting in a greater magnitude of the optical intensity of LED 23. In this manner the decrease in optical intensity at increased temperatures which is inherent in LED's is compensated by an increase in current flowing through the LED.

Conversely, when a low logic state, that is a low voltage, exists at input channel 10, node 18 will have a high voltage. A high voltage at node 18 will cause transistor T10 to turn on and permit current to flow from node 19 to terminal 20 of transistor T10. This current through transistor T10 also flows through resistor R2 causing node 19 to have a low voltage. Node 21 is then at a low voltage and causes transistor T11 to be in a cut off condition with no current permitted to flow through transistor T11. Hence, no current flows through LED 23, and LED 23 is not illuminated.

In this manner a high logic state at input channel 10 causes the LED 23 to be illuminated with an optical intensity which is compensated for temperature variations. A low logic state at input channel 10 causes LED 23 to be not illuminated.

This invention can also be used for conversion of analogue signals into optical signals. This transmitter can be operated such that the magnitude of the optical signal from LED 23 is proportional to the difference in voltage at input channel 10 and input channel 13.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A light emitting diode circuit having first, second and third nodes comprising, first and second terminal means each of which receive a different reference potential thereon comprising, interface means for receiving an input signal and for providing a drive signal therefrom, circuit means comprising first field-effect-transistor means which operates in a switching mode and which has its gate coupled to receive said drive signal and its drain-to-source path coupled between a first node, and one of said terminal means, temperature compensating means coupled across said first and second terminal means comprising, first resistive means coupled between said first terminal and said first node, temperature compensating means coupled between said first and second nodes and in series with said first resistive means, second resistive means coupled between said second node and said second terminal and in series with said temperature compensation means, second field effect transistor means which has its gate coupled to said second node and its drain-to-source path coupled between said first terminal and said third node, and light emitting diode means coupled between said third node and said second terminal and in series with said drain-to-source path of said second field effect transistor means.

2. A circuit as claimed in claim 1 wherein said circuit means comprises at least one diode means coupled in series with said drain-to-source path of said first field-effect-transistor means.

3. A circuit as claimed in claim 1 wherein said temperature compensating means comprises at least one diode means coupled in series and between said first and second nodes.

4. A circuit as claimed in claim 1 wherein said interface means comprises circuit means for interfacing with emitter coupled logic circuits.

5. A circuit as claimed in claim 4 wherein said interface means comprises differential amplifier means which has two inputs each of which receives an emitter coupled logic input signal that is the logical inverse of the other.

6. A circuit as claimed in claim 4 wherein said circuit means comprises at least one diode means coupled in series with said drain-to-source path of said first field effect transistor means.

7. A circuit as claimed in claim 4 wherein said temperature compensating means comprises at least one diode means coupled in series and between said first and second nodes.

8. A circuit as claimed in claim 7 wherein said circuit means comprises at least one diode means coupled in series with said drain-to-source path of said first field effect transistor means.

9. A circuit as claimed in claim 5 wherein said circuit means comprises at least one diode means coupled in series with said drain-to-source path of said first field effect transistor means.

10. A circuit as claimed in claim 5 wherein said temperature compensating means comprises at least one diode means coupled in series and between said first and second nodes.

11. A circuit as claimed in claim 10 wherein said circuit means comprises at least one diode means coupled in series with said drain-to-source path of said first field effect transistor means.

* * * * *